(12) United States Patent  (10) Patent No.: US 7,460,033 B2
Iyer et al.  (45) Date of Patent: Dec. 2, 2008

(54) METHOD FOR CREATING AN IN-MEMORY PHYSICAL DICTIONARY FOR DATA COMPRESSION

(75) Inventors: Balakrishna Raghavendra Iyer, San Jose, CA (US); Piotr M. Plachta, Toronto (CA); Wolfram Sauer, Austin, TX (US); Steven W. White, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/617,610

(22) Filed: Dec. 28, 2006

(65) Prior Publication Data

US 2008/0162517 A1    Jul. 3, 2008

(51) Int. Cl.
*H03M 7/34*  (2006.01)
(52) U.S. Cl. .............................. 341/51; 341/50; 341/107
(58) Field of Classification Search .................. 341/50, 341/51, 79, 65, 107
See application file for complete search history.

(56) References Cited

U.S. PATENT DOCUMENTS

| 5,151,697 | A * | 9/1992 | Bunton | 341/51 |
| 6,657,564 | B2 * | 12/2003 | Malik | 341/51 |
| 7,154,416 | B1 * | 12/2006 | Savage | 341/51 |
| 7,283,072 | B1 * | 10/2007 | Plachta et al. | 341/107 |

OTHER PUBLICATIONS

Meikel Poess, Dmitry Potapov, Data compression in Oracle; Proceedings of the 29th VLDB Conference, 2003, p. 11, Berlin, Germany.

Balakrishna R. Iyer, David Wilhite, Data Compression Support in Databases, Proceedings of the 20th VLDB Conference, 1994, pp. 695-704, Santiago, Chile.

Paolo Bruni, Rama Naidoo, DB2 for OS/390 and Data Compression, International Technical Support Organization, http://www.redbooks.ibm.com, Nov. 1998, pp. 1-156, First Edition, Version 5 of DB2 for OS/390, Program No. 5655-DB2.

Enterprise Systems Architecture/390 Data Compression, Nov. 1996, pp. 1-59, Second Edition, Document No. SA22-7208-01, File No. S390-01.

Meikel Poess, Table Compression in Oracle9i Release 2: A Performance Analysis, An Oracle White Paper, Jan. 2003, pp. 1-21.

Cetin Ozbutun, Table Compression in Oracle9i Release 2, An Oracle White Paper, May 2002, pp. 1-9.

Mark Morris, Teradata Multi-Value Compression V2R5.0, A Teradata White Paper, Jul. 2002, pp. 1-11.

* cited by examiner

*Primary Examiner*—Jean B Jeanglaude
(74) *Attorney, Agent, or Firm*—Sughrue Mion, PLLC (57) ABSTRACT

Some aspects of the invention provide methods for creating an in-memory physical dictionary for data compression. To that end, in accordance with aspects of the present invention, a new heuristic is defined for converting each of the plurality of logical nodes into a corresponding physical node forming a plurality of physical nodes; then place each of the physical nodes into the physical dictionary while traversing the dictionary tree in descending visit count order. Each physical node is placed in its nearest ascendant's cache-line with sufficient space. If there is no space in any of the ascendant's cache-line, then the physical node is placed into a new cache-line, unless a pre-defined packing threshold has been reached, in which case the physical node is placed in the first available cache-line.

5 Claims, 6 Drawing Sheets

FIG. 1A

22 { ...AbAl...Abs...Abi...Ali...Alt

FIG. 1B

| Symbol | Pointer | Character-String |
|---|---|---|
| 0 | | |
| ⋮ | ⋮ | ⋮ |
| 65 | 210 | A |
| ⋮ | ⋮ | ⋮ |
| 257 | 220 | Ab |
| 258 | 230 | Al |
| ⋮ | ⋮ | ⋮ |
| 261 | 222 | Abs |
| ⋮ | ⋮ | ⋮ |
| 270 | 224 | Abi |
| ⋮ | ⋮ | ⋮ |
| 280 | 232 | Ali |
| ⋮ | ⋮ | ⋮ |
| 290 | 234 | Alt |
| ⋮ | ⋮ | ⋮ |
| 4095 | | |

METHOD FOR CREATING AN IN-MEMORY PHYSICAL DICTIONARY FOR DATA COMPRESSION

FIELD OF THE INVENTION

The invention relates to data compression and, in particular, to methods, systems, and computer program products for creating an in-memory physical dictionary for use in data compression.

BACKGROUND OF THE INVENTION

Data compression methods can be divided into two broad categories: namely, "lossy" and lossless data compression methods. Lossy data compression methods result in a loss of some information during compression. On the other hand, lossless data compression refers to the ability to change a data set, without losing information, so that the data set can be stored within less space after compression as compared to before compression. Lossy compression methods are often employed in situations where a loss of information is tolerable (e.g. compression of audio and video data). By contrast, lossless compression methods are preferably employed in situations where a loss of information is undesirable and fidelity is a priority (e.g. compression of text files in a database).

Lossless data compression methods—as particularly applied in database systems storing text information—help to reduce capital and operating costs. A typical database system has a finite amount of storage (e.g. memory, disk space and the like). As the amount of information in a database increases, new allocations of storage may be required. However, adding and maintaining additional blocks of memory adds capital and operating costs. In the context of large database systems, such as those employed in the financial services sector, such capital and operating cost increases can make database management very expensive. Accordingly, compressing data is a useful way of utilizing available storage and limiting requirements for new allocations of storage.

A particular subset of lossless data compression methods, referred to hereinafter as binary-string/symbol substitution methods, have been developed that exploit the redundancy of byte-strings repeated within a text file. Compression is accomplished by replacing frequently occurring byte-strings with shorter identifiers/placeholders, referred to hereinafter as symbols. The Lempel-Ziv 1978 (LZ78) method of data compression is at the root of this class of binary-string/symbol substitution methods. In accordance with the LZ78 method: a static dictionary is created that contains frequently occurring byte-strings and corresponding symbols; and, compression is accomplished by replacing frequently occurring byte-strings with respective symbols (i.e. exchanging text-symbol pairs).

A number of criteria are considered when evaluating the performance of a compression method, such as for example, computational overhead, efficiency and compression ratio. As a general rule, for compression to be considered effective, the storage allocation for the combination of a static dictionary and a respective compressed data set should be substantially smaller than that for the corresponding uncompressed data set. To that end, a static dictionary is typically defined as having a fixed and limited size, which in turn means that only the most frequently occurring byte-strings are stored in accordance with known methods of creating a static dictionary. However, there are a number of problems associated with this.

The most frequently occurring byte-strings are typically quite short, which means that the longest byte-strings that could be used may not be stored for use in the static dictionary since the dictionary is biased towards retaining shorter more frequently occurring byte-strings. Yet, during the actual compression process byte-strings in the data set are matched to the longest byte-strings stored in the static dictionary. Subsequently, the static dictionary contains a number of short byte-strings that are rarely used, and the resultant compression ratio of the compression process may be reduced because the longest byte-strings that could be matched may not be stored in the static dictionary for use during the compression process.

U.S. patent application Ser. No. 11/278,118 (filed Mar. 30, 2006) discloses a method for creating a static dictionary, the method comprising: providing a plurality of data trees, each of the plurality of data trees comprising a root node, at least one of the plurality of data trees comprising at least one child node, wherein each root node and each child node stores an associated binary pattern, wherein each child node is adapted to store a symbol associated with the child node and an occurrence count value associated with the child node; defining a binary pattern string, the binary pattern string comprising a concatenation of the binary patterns in a direct path from the root node to a particular child node, and wherein an occurrence count value for the binary pattern string is the occurrence count value of the particular child node; and, incrementing the occurrence count value of the binary pattern string when the particular child node is visited. This approach is based on counting the number of times an end-node of a particular byte-string is visited, while not incrementing a count for nodes storing characters in the middle of the byte-string as often as each time such nodes are visited. The result is an occurrence count metric that favors longer byte-strings.

Regardless of the manner in which the logical tree for compression is constructed, during compression operation, a binary representation of the logical tree must be used (a physical compression dictionary). This binary representation must be properly set up so as to minimize CPU usage, amongst other resources. Otherwise, compression will take a long time.

SUMMARY OF THE INVENTION

A preferred embodiment of the invention is directed to a method for creating an in-memory physical dictionary corresponding to a logical dictionary tree comprising a plurality of logical nodes for data compression comprising the steps of: converting each of the plurality of logical nodes into a corresponding physical node forming a plurality of physical nodes; placing a root physical node of the plurality of physical nodes into the physical dictionary; and placing each of the remaining plurality of physical nodes into the physical dictionary while traversing the dictionary tree in descending visit count order.

In accordance with some aspects of the invention, placing the root physical node into the physical dictionary includes: placing the root physical node into a new cache-line if a packing threshold has not been reached; and placing the root physical node into the first available space in any cache-line if the packing threshold has been reached.

In accordance with some aspects of the invention, placing each of the remaining plurality of physical nodes into the physical dictionary while traversing the dictionary tree in descending visit count order includes: placing a physical node into the physical dictionary if not a root node; and placing the children nodes of the physical node into the physical dictionary, if any, in order of descending visit count.

In accordance with some aspects of the invention, wherein placing a physical node into the physical dictionary includes: examining the cache-lines of the ascendant nodes of the physical node in ascending order until either sufficient space is found or the root node is reached; placing the physical node into the cache-line of the first ascendant node found with sufficient cache-line space; and placing the physical node into a secondary cache-line if no ascendant node is found with sufficient cache-line space, In accordance with some aspects of the invention, the secondary cache-line is a new cache-line if a packing threshold has not been reached; and the secondary cache-line is any cache-line with a first available space if the packing threshold has been reached.

In accordance with some aspects of the invention, the packing threshold is defined as the instantaneous proportion of physical dictionary storage occupied by physical nodes.

In accordance with some aspects of the invention, the plurality of physical nodes comprise at least one branching node and at least one non-branching nodes.

BRIEF DESCRIPTION OF THE DRAWINGS

For a better understanding of the present invention, and to show more clearly how it may be carried into effect, reference will now be made, by way of example, to the accompanying drawings, which illustrate aspects of embodiments of the present invention and in which.

DETAILED DESCRIPTION

At least one data tree is often included in a static dictionary. A data tree has a number of nodes that are each used to store a single character from a byte-string. The branching pattern of a data tree defines the relationship between nodes and thus the arrangement of byte-strings stored in the data tree. In accordance with previously known methods of creating a static dictionary, each node storing a character is provided with a respective frequency count value that is incremented each time the node is visited. Accordingly, for a byte-string of arbitrary length the nodes storing characters near the beginning of the byte-string will inherently have a higher frequency count value than those nodes near the end of the byte-string, since the nodes near the beginning must be traversed to reach the nodes near the end. This biases the byte-strings stored in the static dictionary to those represented by nodes having the highest frequency count value. As a result, short byte-strings, often made up of nodes near the beginning of a longer byte-string, are preferred by such methods.

By contrast, a different heuristic has been defined in U.S. patent application Ser. No. 11/278,118 to replace the aforementioned frequency count metric used to record the number of times a particular node in a data tree is visited. This heuristic is based on counting the number of times an end-node of a particular byte-string is visited, while not incrementing a count for nodes storing characters in the middle of the byte-string as often as each time such nodes are visited. The result is an occurrence count metric that favors longer byte-strings. This results in a logical dictionary which maps symbols to strings.

However, this logical dictionary on its own is not sufficient for production purposes to compress strings. Actual a binary representation physical dictionary is needed for compression.

Embodiments of the present invention provide for methods, systems, and computer program products for creating an in-memory physical dictionary for compressing data.

Aspects of the invention may be embodied in a number of forms. For example, various aspects of the invention can be embodied in a suitable combination of hardware, software and firmware. In particular, some embodiments include, without limitation, entirely hardware, entirely software, entirely firmware or some suitable combination of hardware, software and firmware. In a preferred embodiment, the invention is implemented in software, which includes but is not limited to firmware, resident software, microcode, etc.

Additionally and/or alternatively, aspects of the invention can be embodied in the form of a computer program product accessible from a computer-usable or computer-readable medium providing program code for use by or in connection with a computer or any instruction execution system. For the purposes of this description, a computer-usable or computer readable medium can be any apparatus that can contain, store, communicate, propagate, or transport the program for use by or in connection with the instruction execution system, apparatus, or device.

A computer-readable medium can be an electronic, magnetic, optical, electromagnetic, infrared, or semiconductor system (or apparatus or device) or a propagation medium. Examples of a computer-readable medium include a semiconductor and/or solid-state memory, magnetic tape, a removable computer diskette, a random access memory (RAM), a read-only memory (ROM), a rigid magnetic disk and an optical disk. Current examples of optical disks include, without limitation, compact disk—read only memory (CD-ROM), compact disk—read/write (CD-R/W) and DVD.

In accordance with aspects of the invention, a data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output (i.e. I/O devices)—including but not limited to keyboards, displays, pointing devices, etc.—can be coupled to the system either directly or through intervening I/O controllers.

Network adapters may also be coupled to the system to enable communication between multiple data processing systems, remote printers, or storage devices through intervening private or public networks. Modems, cable modems and Ethernet cards are just a few of the currently available types of network adapters.

Figure 1A:
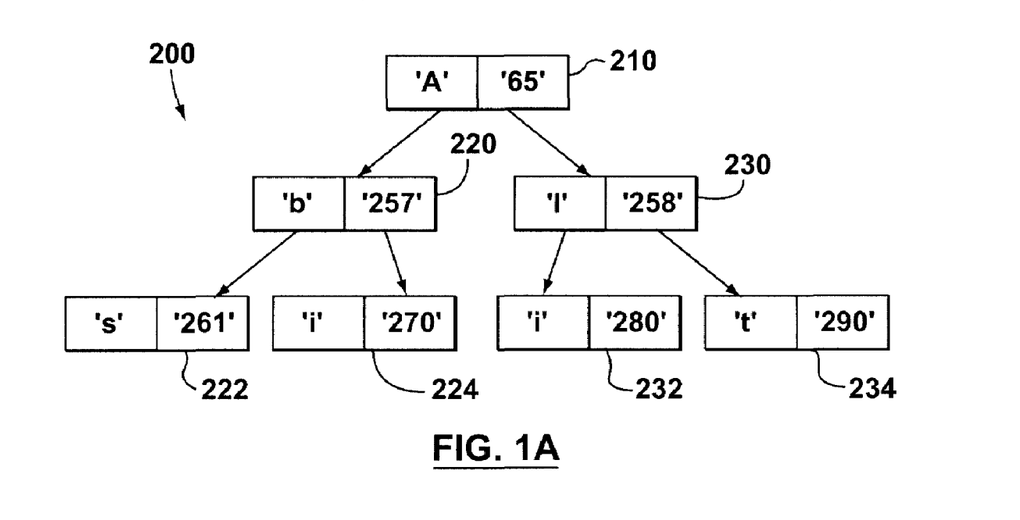
FIG. 1A is a block diagram illustration of an example data tree.

A static dictionary includes a combination of a collection of one or more data trees and a symbol table. That is, a static dictionary is represented by a trie, which is a collection of multi-child trees in common prefix or common suffix form. The trie maps a byte-string to a symbol. Each data tree stores a respective set of byte-strings. The symbol table stores symbols relating to each byte-string stored in the collection of data trees. A symbol table is not necessary since the tree could always be exhaustively searched to find a given symbol. FIGS. 1A and 1C are illustrative examples of a data tree 200 and a symbol table, created from a partially shown data set 22 provided in FIG. 1B.

A static dictionary is only addressable in a finite amount of space, which means the number of symbols that may be used is limited. Thus, it is beneficial to select the most efficient symbols. In accordance with aspects of the present invention a definition of efficiency is the degree to which compression ratio is improved, while reducing the dictionary size.

Generally, each data tree includes a single root node and possibly one or more child nodes, where each node stores an arbitrary character and a corresponding symbol unique to the node that is also stored in the symbol table. A data tree extends from the root node. That is, a root node serves as a parent node to one or more child nodes storing the same or other characters as the root node. A particular child node may also serve as a parent node to additional child nodes that are lower in the data tree than the particular child node. However, it is preferable that each child node has only one direct parent node. It was noted above that each data tree stores a respective set of byte-strings. More specifically, each data tree is a common-prefix or common-suffix representation of a byte-string. As such, retrieval of a particular byte-string involves concatenating characters encountered on a direct path from the root node to a respective child node storing the last character of the byte-string.

Each root node preferably stores a unique byte from the Extended ASCII Character Set as a corresponding unique 8-bit binary number. Those skilled in the art will appreciate that there are 256 such unique 8-bit binary numbers in the Extended ASCII Character Set. Thus, in accordance with some aspects of the invention, there may be 256 root nodes for a corresponding set of 256 data trees included in the static dictionary. That is each of the 256 data trees is uniquely identifiable by the character stored in a respective root node. For example, a first root node may store the null character " ", a 65th root node may store the character "A" and a 97th root node may store the character "a". Those skilled in the art will also appreciate that other character sets (e.g. the complex and simplified Chinese character sets) with more or less than 256 characters may also be used to define root nodes. Those skilled in the art will also appreciate that, while a byte is normally considered a binary pattern of 8-bits, different numbers of bits may be considered for the definition of characters and other types of information. As such, although this discussion is conducted with respect to bytes, those skilled in the art will appreciate that a "byte" is interchangeable with a "binary pattern" of any length, which in turn means a "byte-string" is interchangeable with "binary pattern string". Moreover, the terms "byte" and "byte-string" are only used for brevity and to help describe examples, given that the concept of a "byte" is commonly understood in the art to include a collection of bits (e.g. 8-bits) grouped together.

Figure 1B:
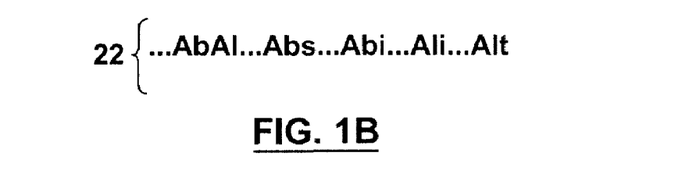
FIG. 1B is an example of a partially shown byte-string in a data set used to create the data tree illustrated in FIG. 1A.
Figure 1C:
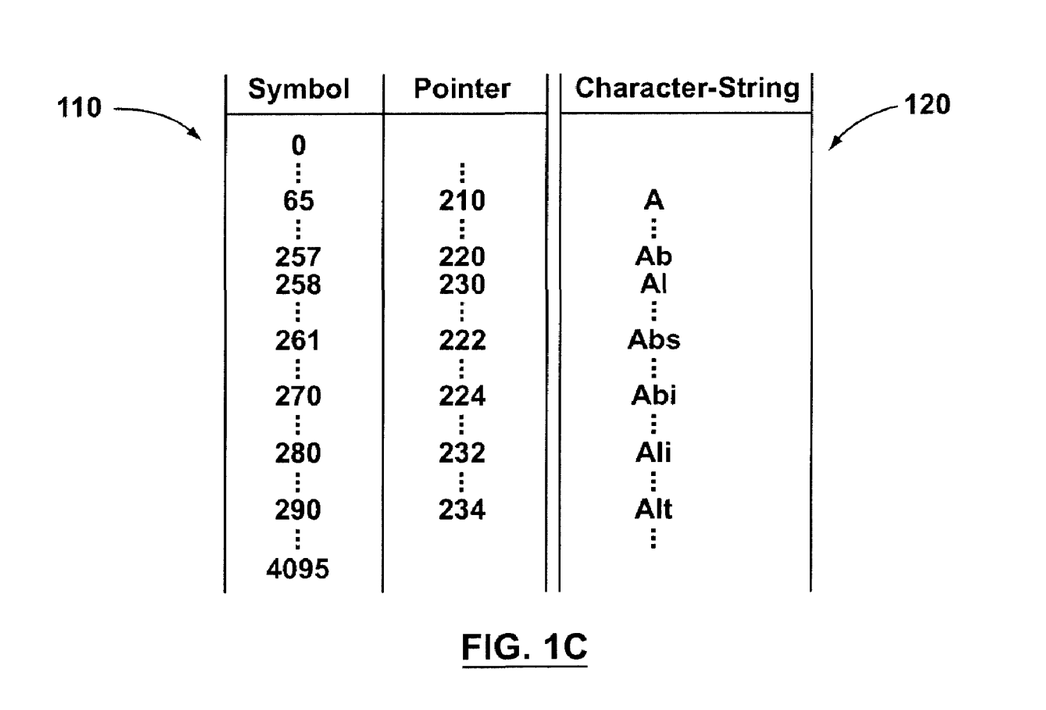
FIG. 1C is an example of a symbol table corresponding to the data tree illustrated in FIG. 1A.

Referring to FIGS. 1A and 1B, provided as an illustrative example only, shown is an example of the single data tree 200 created from the data set 22, which is partially shown including only a portion of the data set 22 relevant to the data tree 20. The data tree 200 has a root node 210, storing the character "A" and symbol "65". The root node 210 has first and second child nodes 220 and 230, storing respective characters "b" and "l" with corresponding symbols "257" and "258". The first child node 220 has third and fourth child nodes 222 and 224, storing respective characters "s" and "i" with corresponding symbols "261" and "270". The second child node 230 has fifth and sixth child nodes 232 and 234, storing respective characters "i" and "f" with corresponding symbols "280" and "290". Although the root node 210, and the first and second child nodes 220 and 230 are illustrated as specifically having two child nodes each, those skilled in the art will appreciate that more generally a node serving as a parent may have any number of child nodes.

Creating a data tree (e.g. tree 200) includes parsing through a data set (e.g. data set 22) or a sample portion of the data set and identifying repetitive byte-strings. The basic process involves adding child nodes to the ends of existing byte-strings stored in data trees. Such a process starts by matching an initial character from the data set to an appropriate root node and then matching subsequent characters to child nodes until the end of the byte-string is found. A new child node is then added to the end of the byte-string, and then the next character from the data set is matched to a corresponding root node and the process repeats. This process may be limited by various design choices, such as storage size.

A symbol table includes a listing of symbols. Each symbol is unique and corresponds to a particular node in one of the collection of data trees included in a static dictionary. Moreover, each symbol corresponds to the end of a respective byte-string. A symbol table also includes a listing of pointers, where each pointer corresponds to a particular node that a respective symbol corresponds to. As already noted, a static dictionary is a finite size. Thus, it is not always possible to store all byte-strings identified in a data set. Accordingly, a static dictionary is often grown in steps that include: growing the data trees until a predetermined number of nodes or symbols is reached; evaluating which nodes (and thus byte-strings) are worth keeping; removing (i.e. pruning) the nodes determined not to be worth keeping; repeating the growth and pruning of the data trees, as described, until the entire data set or sample portion of the data set has been processed; and finally pruning the data trees down to a desired final size (i.e. number of symbols or nodes).

Turning to FIG. 1C, shown is a portion of an example of a symbol table 110 including only information relevant to the data tree 200 shown in FIG. 1A. However, those skilled in the art will appreciate that a symbol table more specifically includes symbols from one or more data trees used to define a static dictionary. For the sake of illustrating the present example only, the pointer values for each symbol correspond to the reference indicia used in FIG. 1A. For example, symbol "270" is shown as having pointer "224". Those skilled in the art will appreciate that a pointer may refer to a storage location address. Moreover, also for the sake of illustrating present example only, the symbol table 110 (FIG. 1C) includes an extra "character-string field" 120 showing the byte-string implied by reference to each particular node in the symbol table 110.

For example, the symbol "270" corresponds to respective byte-string "Abi" which can be retrieved from the data tree 200 by concatenating characters encountered on a direct path from the root node 210 to the fourth child node 224. The byte-string "Abi" includes the byte-string "Ab", which can be retrieved from the data tree 200 by concatenating characters encountered on a direct path from the root node 210 to the first child node 220. Moreover, with specific reference to FIG. 1B, it is clear that the shorter byte-string "Ab" is present in the data set 22 more often than the byte-string "Abi". However, the byte-string "Abi" may provide a better compression ratio, and thus, methods can favor longer byte-strings, as opposed to the shorter byte-strings included near the beginning of the longer byte-strings. By contrast, previously known methods of building a static dictionary favor short byte-strings, such as "Ab", that have higher frequency count values than longer byte-strings, such as "Abs".

Briefly, in operation, using a static dictionary defined by a collection of data trees and a symbol table, compression is accomplished by: selecting characters from the data set; traversing the data trees until a child node is encountered that does not have any child nodes of its own; and inserting the symbol of that child node in place of a byte-string in the data set that matches a corresponding byte-string obtained in a direct path from a particular root node to the child node. On the other hand, expansion is accomplished by: parsing a compressed data set so as to identify symbols; retrieving a respective pointer for each symbol from the symbol table; and, inserting a corresponding byte-string back into the data set in place of a particular symbol, where the byte-string matches a corresponding byte-string obtained in a direct path from a particular root node to the child node.

Generally, compression ratio is defined as the size of data after compression divided by the size of the data before compression. The size of the data before and after compression is measurable in terms of bits, bytes, words frames and the like. Before a data set is compressed the size of the data includes the data set itself, whereas after a data set is compressed the size of the data includes the size of the compressed data set and the memory required to store the static dictionary. If multiple data sets can be compressed using the same static dictionary, then the compression ratio is calculated taking into account that the size of the data before compression is the sum of the sizes of the data sets, and the size of the data after compression is the sum of the sizes of the corresponding compressed data sets plus the memory required to store the static dictionary. Additionally and/or alternatively, the size of the static dictionary is not included in the calculation of compression ratio as its effect on compression is small.

Symbols can be evaluated in terms of efficiency. Efficiency of a symbol is calculated as the number of times a corresponding byte-string occurs in a data set (or portion of a data set) multiplied by the length of the byte-string.

For the actual compression process, a physical in-memory dictionary must be used, which is a binary representation of the dictionary tree discussed above. A physical dictionary is populated by "physical nodes".

Figure 2:
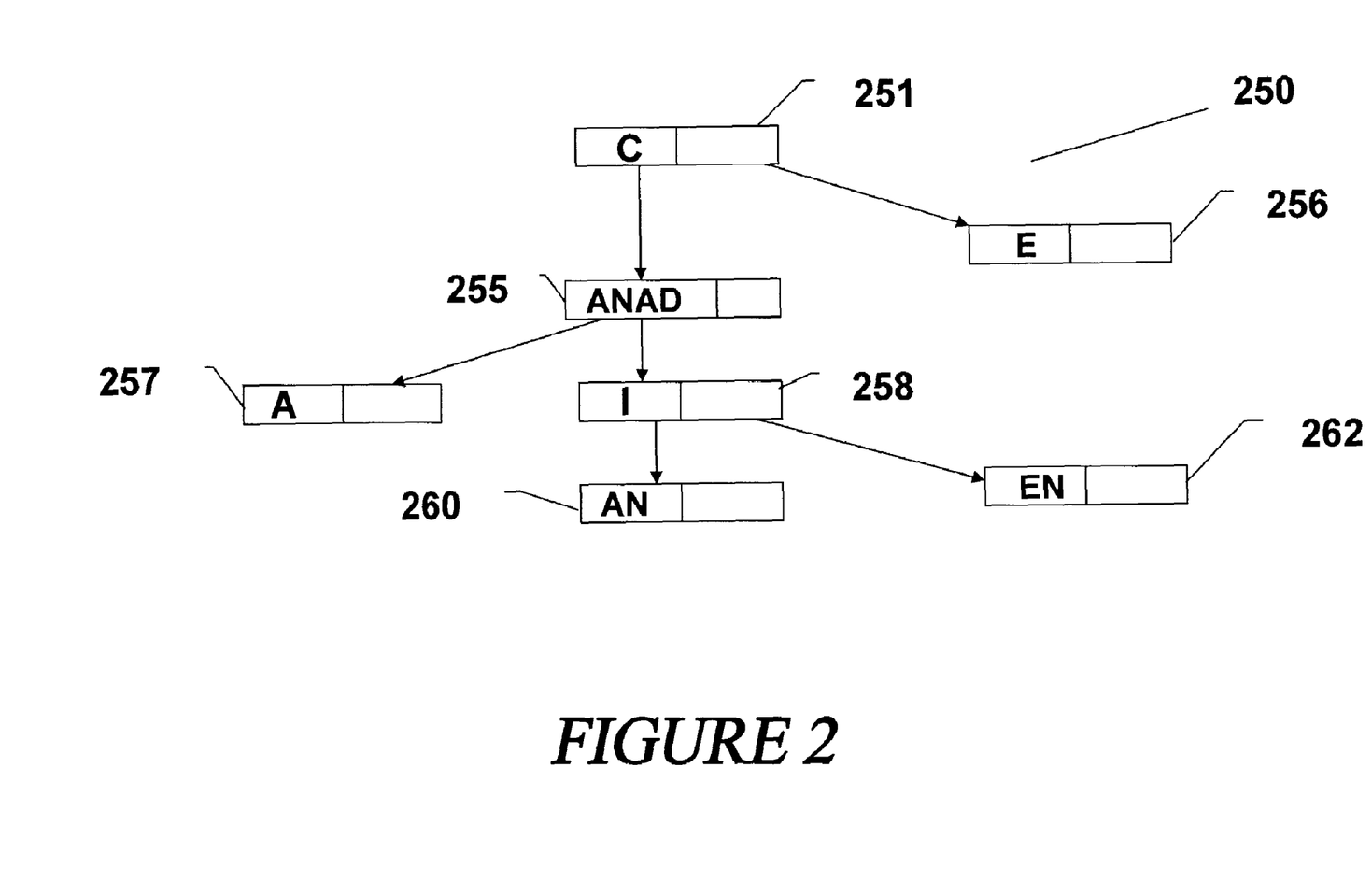
FIG. 2 is a block diagram illustration of a sample logical dictionary tree.

Referring to FIG. 2, a logical tree 250 is shown. The physical dictionary would contain a physical node for each of the nodes 251 255 256 257 258 260 262. For example, node 251 in FIG. 2 is a node with two child nodes 255 256. Node 251 is associated with a single symbol ("C"). Node 255 in FIG. 2 is a node representing the string of symbols "ANAD" and having 2 child nodes 257 258. Of course, it is clear to the man skilled in the art that node 255 may be replaced by a series of sequentially linked nodes, each with one or more associated symbols, (with possible performance hits during compression). Node 255 may be replaced by 4 nodes serially linked, each with only one associated character. In all cases, each node in the logical dictionary tree will have its equivalent in the physical dictionary, preferably on a one-to-one basis (but not absolutely necessary).

In a preferred embodiment, each physical node of the physical dictionary occupies a slot (variable sized as discussed later) in a contiguous block of main memory set aside for the physical dictionary. External pointers exist pointing to the root node of the dictionary trees.

Each physical node is of size which enables aligned access to the node in memory, e.g. units of 4 bytes (word). Unaligned memory access is very expensive (tens if not hundreds of times, depending on the platform) and to be avoided. One embodiment of a physical node would minimally contain a field indicating the number of children the node has, a field to indicate the number of characters associated with the node, a field indicating whether the node represents a valid symbol, and a field for the symbol number the node represents (if it represented a valid symbol). If the node has more than zero children, then fields for a pointer to each child would be part of the variable sized node. Similarly, if there is more than one character, then the node would have one field for each character. However, it is clear to a person skilled in the art that an actual implementation may depart from this description.

According to one aspect of this invention, the physical dictionary has two types of nodes: branching nodes and non-branching nodes. Referring to FIG. 2, a logical tree 250 is shown with both types of nodes. A branching node has only a single symbol; it can have zero or more leaf (children) nodes extending therefrom. For example, node 255 in FIG. 2 is a branching node with two child nodes 257 258.

A non-branching (multi-character) node has associated with it at least one character. For example, node 260 in FIG. 2 is a non-branching type of node representing the string of symbols "AN".

Figure 3A:
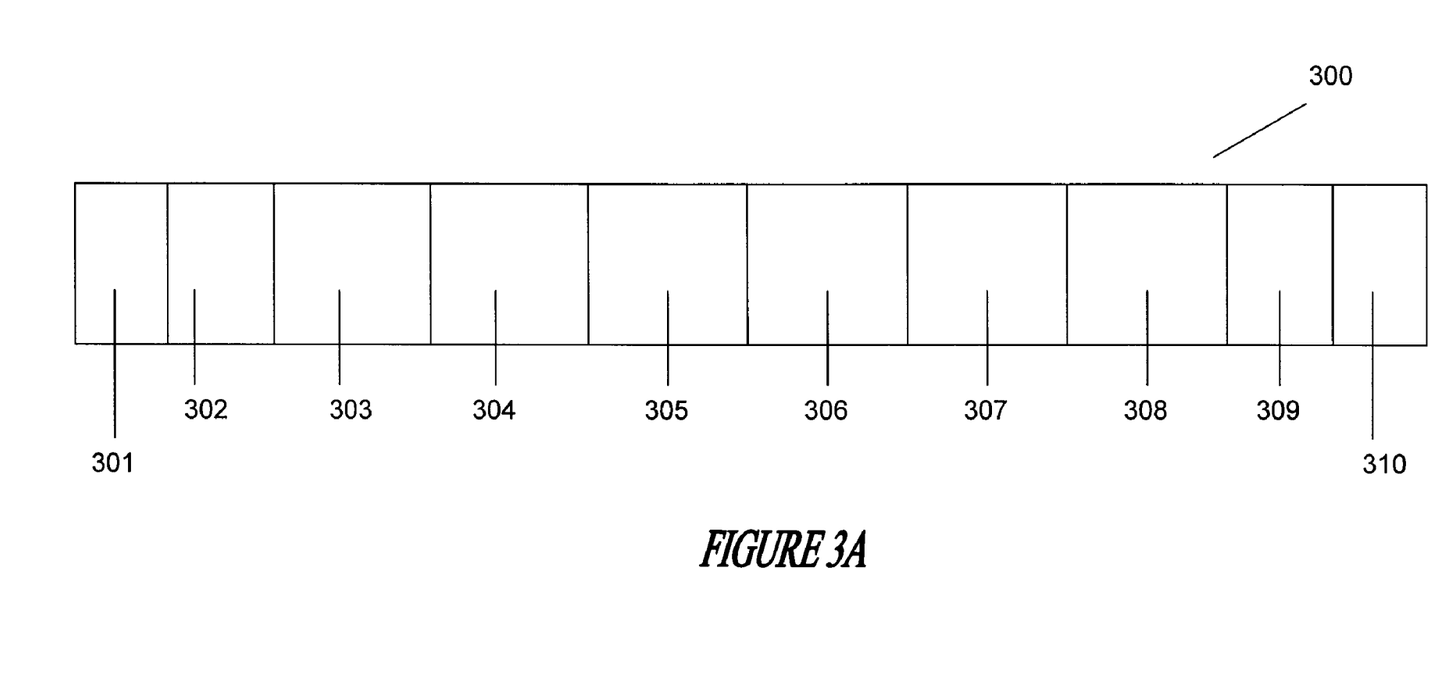
FIG. 3A is a block diagram illustrating an exemplary physical branching node.

FIG. 3A shows the layout of a first exemplary node 300 with 2 children. This branching node 300 has a number of fields. A Child Count field 301 records how many children the branching node 300 has. According to one aspect of the invention, this field is a single byte (8 bits) long. In a variation, the actual number of children is the binary value of the Child Count field 301 minus one (if the Child Count field has binary value 0 then only a single child exists). A value of 0 preferably indicates that this node is a non-branching node and not a branching node.

Another possible field is the Valid Symbol Marker field 302, which indicates whether this branching node 300 represents a valid symbol. A further possible field is a Node Type field 303, which provides a general indication whether this node 300 is a branching node or a non-branching node. A Node Symbol field 304 contains the binary representation of the symbol for this branching node 300.

For each child of a branching node 300 there are at least two fields in the physical node of the branching node 300. Firstly, there is a Child Character field 305 308 for keeping track of what character is represented by the child. During compression, an attempt is made to match the data byte in question to each Child Character field 305 308. If none matches, then the search for a matching symbol ends. Otherwise, the Child Pointer field 307 310 may be followed.

A Terminal Marker field 306 309 indicates whether this child is a terminal, i.e. it has no children of its own. In a variation where the symbol size is less than or equal to the pointer size, if the child is terminal, then the actual symbol of the child may be contained in the Child Pointer field 307 310.

A number of the above fields may be a single bit in length. These are the Valid Symbol Marker field 302, the Node type field 303, and the Terminal Marker field 306 309. In accordance with preferred features, these fields all take the value of zero (0) in the most common cases: 0 if a valid symbol; 0 if a branching node; and 0 if not a terminal child. This is so that these values may be checked first during execution, a technique known to the man skilled in the art to help reduce branch mispredictions when these fields are accessed later, and will help reduce CPU usage during compression.

The size for each pointer field is a function of the size of the dictionary. If the dictionary (physical and logical) is chosen to be fairly small, then the pointers, which are preferably offsets from the beginning of the storage area (main memory or disk) occupied by the physical dictionary, can be relatively short in size. In an exemplary implementation, the Child Pointer field is a two bytes in length. It is clear that this will be able to resolve 65536 addresses. The storage set aside for each child of a branching node should be a multiple of the word size, typically a single word (even if the actual required storage for the 3 fields mentioned above, Child Symbol, Child Pointer and Terminal Marker, is less than allocated).

Figure 3B:
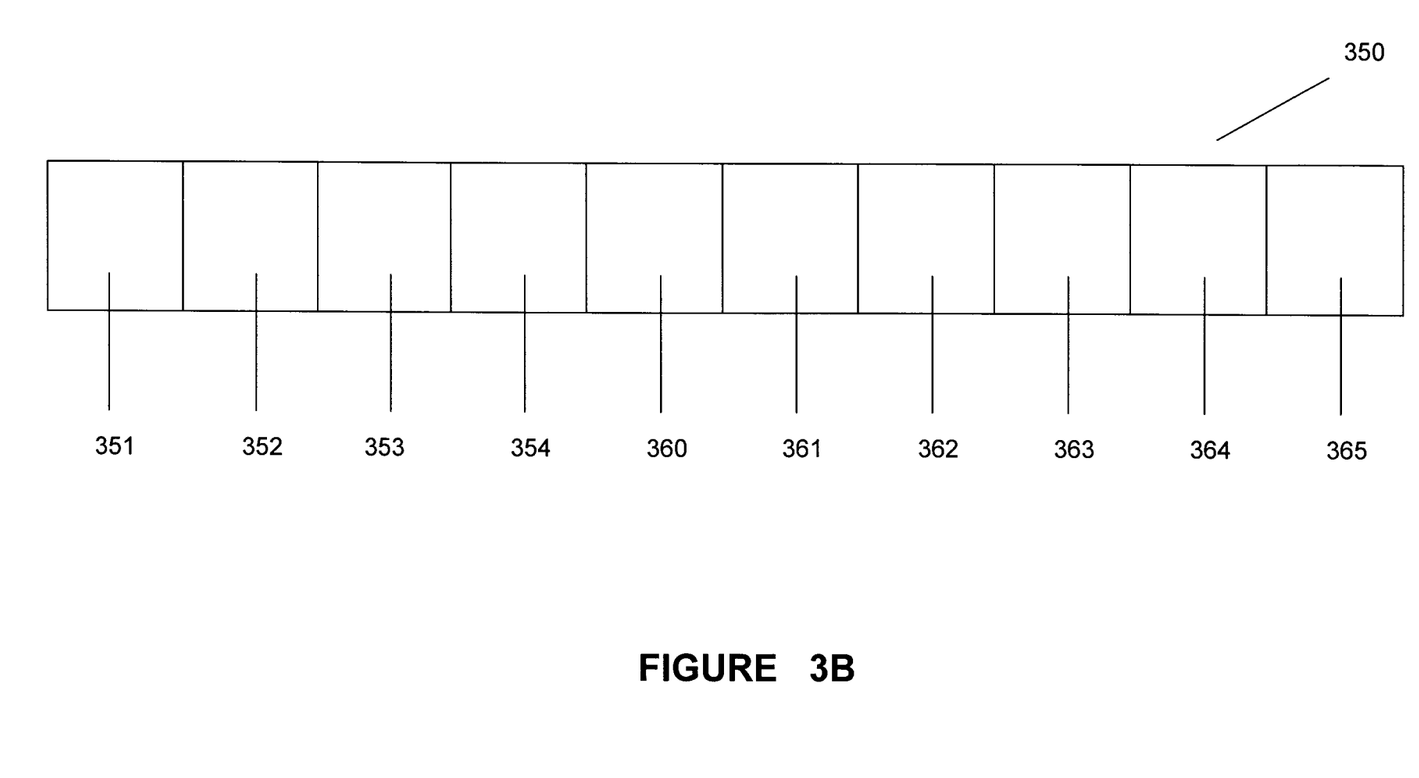
FIG. 3B is a block diagram illustrating an exemplary physical non-branching node.

An exemplary non-branching node 350 is shown in FIG. 3B. The first field 351 is set to zero (0). As with branching nodes, another possible field is the Valid Symbol Marker field 352, which indicates whether this non-branching node 350 represents a valid symbol. A Node Type field 353 provides a general indication whether this node 350 is a branching node or a non-branching node. A Node Symbol field 354 contains the binary representation of the symbol for this branching node 350.

A non-branching node 350 contains the actual characters of the string it represents, shown as character fields 360 361 362 363 and a Terminal Marker field 364, which indicates whether the non-branching node 350 is terminal. The child pointer field 365 is to be followed, if the string matches. In a variation where the symbol size is less than or equal to the pointer size, if the child is terminal, then the actual symbol of the child may be contained in the Child Pointer field 365. Under one approach all non-branching nodes represent the same number of packed characters (same string size). A preferred embodiment has 4 characters as in the case of this exemplary non-branching node, which permits a single 32-bit instruction for improved CPU usage during compression. Shorter symbol sequences can reasonably well be handled by a sequence of regular branching nodes; and longer sequences occur relatively infrequently and can make use of multiple non-branching nodes for part of the sequence. Thus, if there was a non-branching sequence of 6 characters in the dictionary, one non-branching node and two branching nodes would be used to represent it. But there is no specific limitation on this: embodiments of this invention may also include a variable-sized non-branching node with an additional field for indicating the number of children it has.

The nodes of the physical dictionary must be placed on disk and stored as permanent data. The dictionary building process is time consuming and to be avoided unless necessary. The manner in which the nodes of the dictionary are placed in memory can severely impact the runtime performance of compression. For example, if the nodes of the dictionary are placed by pre-order traversal of the dictionary tree, then compression would suffer poor cache behavior at runtime for traversing any path other than pre-order: the memory access path is non-contiguous and would require loading many different cache-lines.

Preferred embodiments of this invention place nodes and their children visited most often (highest visit counts) within the same cache-lines whenever possible. As a result, CPU usage during compression is improved.

Figure 4:
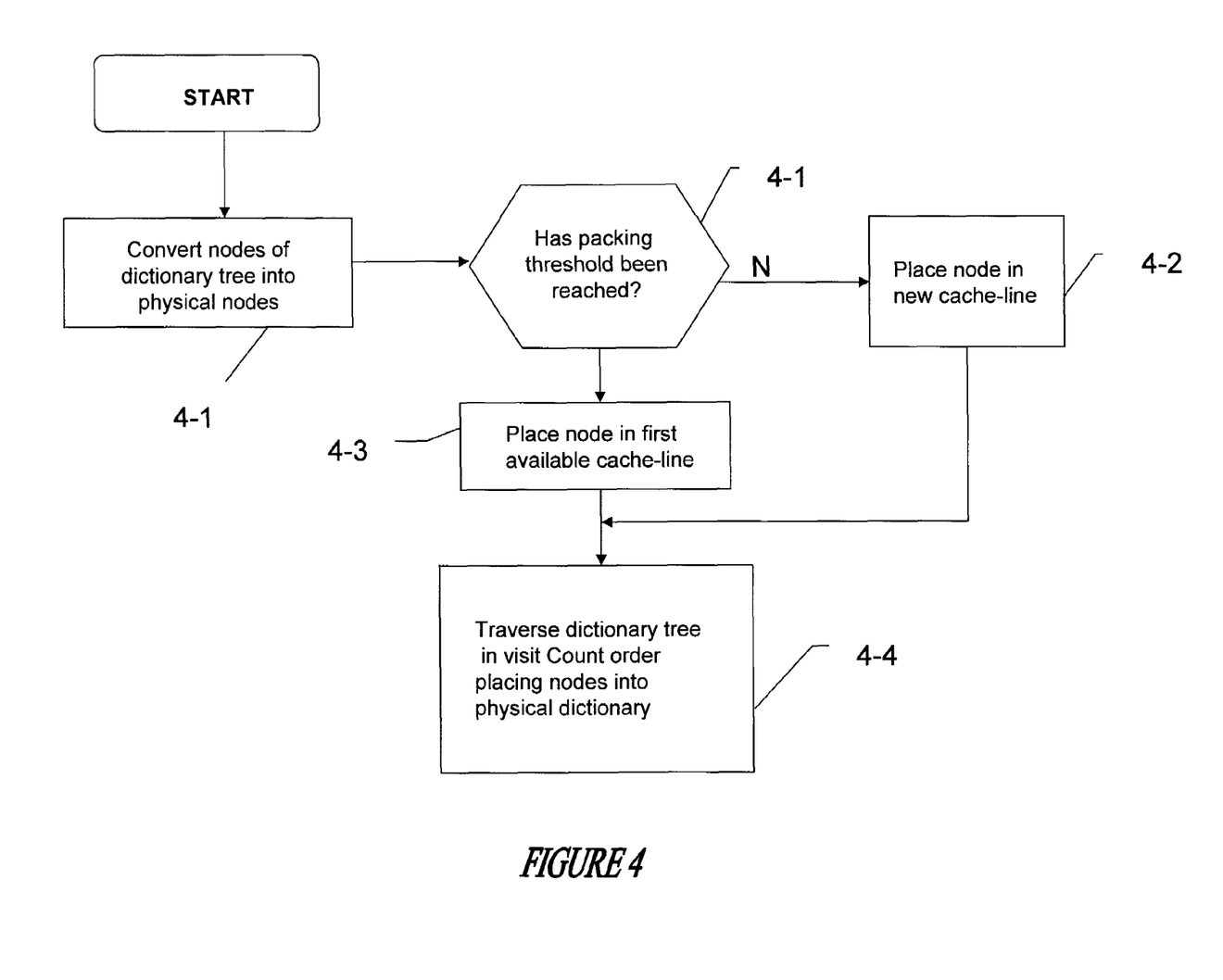
FIG. 4 is flow chart illustrating steps of one method of creating the in-memory physical dictionary in accordance with aspects of the invention.

With reference to FIG. 4, for a given logical tree where the visit count of each child in each node is recorded, the steps of one method for establishing the in-memory framework in accordance with this invention is set out. In step 4-0, convert each logical node of the dictionary tree into a corresponding physical node. In step 4-1, check if the packing threshold has been reached. If the threshold has not been reached, then place the root physical node into a new (unoccupied) cache-line: step 4-2. If the threshold has been reached, then place the root physical node in the first available space in any cache-line: step 4-3. In either case, at step is 4-4, traverse the dictionary tree by visit count order (visit the children of each physical node in descending order of visit count), place each physical node into a cache-line of the physical dictionary using the methodology described in FIG. 5 below.

The packing threshold is chosen to manage the amount of free space in the physical dictionary. One approach is to use a proportion of the dictionary size, e.g. when two-thirds of the space of the physical dictionary has been filled. Another approach is to base the threshold on the proportion of nodes processed, e.g. when one-half of the nodes in the dictionary have been placed into the physical dictionary space.

Figure 5:
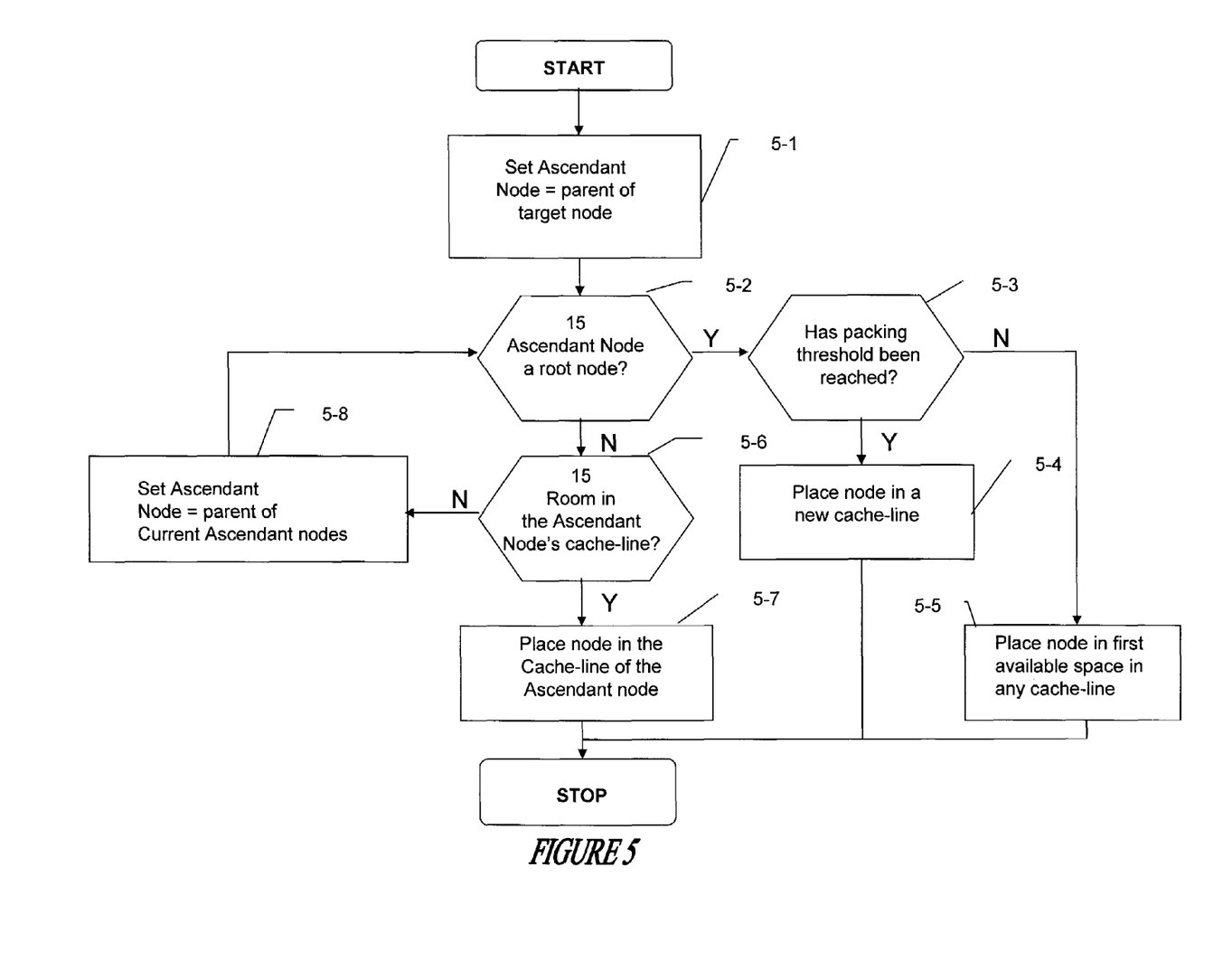
FIG. 5 is a flow chart illustrating one method of how a non-root node may be placed into the physical dictionary in accordance with aspects of the invention.

FIG. 5 illustrates one method of placing a non-root target physical node into a cache-line. At step 5-1, set the current ascendant node to be the parent of the target physical node. The ascendant node is examined to see if it is a root node in step 5-2. If the ascendant node is a root node, then check if the packing threshold has been reach: step 5-3. In step 5-4, if the threshold has not been reached, then place the target physical node into the same cache-line as the ascendant node. If the threshold has been reached, then place the target physical node in the first available space in any cache-line: step 5-5.

If the ascendant node is determined not to be a root node in step 5-2, then determine in step 5-6 whether there is room in the cache-line of the ascendant node to accommodate the target physical node. If there is space, then place the target physical node into the same cache-line as the ascendant node: step 5-7. If there is insufficient space, then set the current ascendant node to be its parent node as step 5-8; then go back to step 5-2.

While the above description provides example embodiments, it will be appreciated that the present invention is susceptible to modification and change without departing from the fair meaning and scope of the accompanying claims. Accordingly, what has been described is merely illustrative of the application of aspects of embodiments of the invention and numerous modifications and variations of the present invention are possible in light of the above teachings.

What is claimed is:

1. A method for creating an in-memory physical dictionary corresponding to a logical dictionary tree comprising a plurality of logical nodes for data compression comprising the steps of:

converting each of the plurality of logical nodes into a corresponding physical node forming a plurality of physical nodes;

placing a root physical node of the plurality of physical nodes into the physical dictionary; and placing each of the remaining plurality of physical nodes into the physical dictionary while traversing the dictionary tree in descending visit count order;

wherein placing the root physical node into the physical dictionary comprises the steps of:

placing the root physical node into a new cache-line if a packing threshold has not been reached; and placing the root physical node into the first available space in any cache-line if the packing threshold has been reached.

2. A method for creating an in-memory physical dictionary corresponding to a logical dictionary tree comprising a plurality of logical nodes for data compression comprising the steps of:

converting each of the plurality of logical nodes into a corresponding physical node forming a plurality of physical nodes;

placing a root physical node of the plurality of physical nodes into the physical dictionary; and placing each of the remaining plurality of physical nodes into the physical dictionary while traversing the dictionary tree in descending visit count order;

wherein placing each of the remaining plurality of physical nodes into the physical dictionary while traversing the dictionary tree in descending visit count order comprises the steps of:

placing a physical node into the physical dictionary if not a root node; and placing the children nodes of the physical node into the physical dictionary, if any, in order of descending visit count.

3. The method of claim 2, wherein the step of placing a physical node into the physical dictionary comprises the steps of:

examining the cache-lines of the ascendant nodes of the physical node in ascending order until either sufficient space is found or the root node is reached;

placing the physical node into the cache-line of the first ascendant node found with sufficient cache-line space; and placing the physical node into a secondary cache-line if no ascendant node is found with sufficient cache-line space.

4. The method of claim 3, wherein the secondary cache-line is a new cache-line if a packing threshold has not been reached; and the secondary cache-line is any cache-line with a first available space if the packing threshold has been reached.

5. The method of claim 4, wherein the packing threshold is defined as the instantaneous proportion of physical dictionary storage occupied by physical nodes.

* * * * *